United States Patent
Craft, Jr. et al.

(10) Patent No.: US 6,169,247 B1
(45) Date of Patent: Jan. 2, 2001

(54) ENCLOSURE FOR ELECTRONIC COMPONENTS

(75) Inventors: Thomas F. Craft, Jr., Hackettstown; Jason A. Kay, Morristown, both of NJ (US); Ivan Pawlenko, Holland, PA (US); Alfonso J. D'Alessio, Boonton, NJ (US); Anthony R. Tancreto, Brooklyn, NY (US); George Shevchuk, Old Bridge, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/095,955

(22) Filed: Jun. 11, 1998

(51) Int. Cl.[7] ........................................... H01B 9/06
(52) U.S. Cl. ................. 174/15.1; 174/15.2; 361/676; 361/688; 361/700
(58) Field of Search ................... 174/15.2, 15.1, 174/16.2; 361/676, 677, 687, 688, 689, 700, 796, 802

(56) References Cited

U.S. PATENT DOCUMENTS

| | | | |
|---|---|---|---|
| 3,489,207 | * 1/1970 | Miller | 165/105 |
| 3,648,113 | * 3/1972 | Rathjen et al. | 317/100 |
| 3,904,933 | * 9/1975 | Davis | 317/100 |
| 4,315,300 | * 2/1982 | Parmerlee et al. | 361/382 |
| 4,414,604 | * 11/1983 | Matsui et al. | 361/385 |
| 4,656,559 | * 4/1987 | Fathi | 361/386 |
| 4,962,444 | * 10/1990 | Niggemann | 361/382 |
| 4,975,803 | * 12/1990 | Niggemann | 361/385 |
| 5,057,968 | * 10/1991 | Morrison | 361/385 |
| 5,329,425 | * 7/1994 | Leyssens et al. | 361/701 |
| 5,404,270 | * 4/1995 | Carlstedt | 361/689 |
| 5,406,807 | * 4/1995 | Ashiwake et al. | 62/376 |
| 5,606,341 | * 2/1997 | Aguilera | 345/87 |
| 5,737,186 | * 4/1998 | Fuesser et al. | 361/699 |

OTHER PUBLICATIONS

Maurice J. Marongiu and Randy Clarksean, Thermal Management of Outdoor Enclosures Using Phase Change Materials, Electronics Cooling, Jan. 1998, vol. 4, No. 1.

* cited by examiner

*Primary Examiner*—Kristine Kincaid
*Assistant Examiner*—William H Mayo, III
(74) *Attorney, Agent, or Firm*—Duane, Morris & Heckscher LLP

(57) ABSTRACT

An enclosure for electronic devices has a wall of a rigid plastic material, with elongated chambers defined therein. The chambers are filled with a material having a high thermal conductivity, or materials having high heat capacity, such as phase change material. Each chamber is located so that the material in the chamber is in thermal contact with the wall at a first location that tends to be at a relatively high temperature, and at a second location that tends to be at a lower temperature. The enclosure may alternatively have heat pipes of metal rather than chambers.

23 Claims, 2 Drawing Sheets

US 6,169,247 B1

ENCLOSURE FOR ELECTRONIC COMPONENTS

FIELD OF THE INVENTION

This invention relates to enclosures for electronic components, and particularly to enclosures for electronic devices intended for use in locations exposed to weather.

BACKGROUND OF THE INVENTION

Electronic components are placed in locations exposed to weather for use in a wide variety of applications, including POTS (plain old telephone service), ISDN (integrated services digital network), data lines, cellular telephone equipment, and cable television equipment. Components placed in outdoor locations include, by way of example, network interface devices, network interface units, and terminal boxes. Conventionally, sealed metal boxes or cabinets are provided for components to protect them from weather and other foreign objects. Enclosures with walls of solid plastic are preferable from the standpoints of cost, ease of manufacture, lack of susceptibility to corrosion, and ability to conform to a desired appearance for aesthetic purposes. Plastics used for walls of solid plastic include, by way of example only, crystalline thermoplastic polyesters, such as that sold by General Electric under the trademark VALOX.

Sealed enclosures for electronics are susceptible to increases in temperature in the air inside the enclosure. Solar loading for enclosures exposed to sunlight, and the heat generated by the electronics, are the principal sources of the heat energy. Solar loading refers to energy received by absorption of solar radiation. Sealed enclosures limit convective cooling. Excessive temperatures of course damage electronic components and reduce component life. Even metal enclosures are provided with heat exchangers and other systems for reducing thermal loading. Heat dissipation in metal enclosures is further improved by the use of designs that increase the ratio of surface area of the metal to the volume of the interior of the enclosure. For example, known designs of metal enclosures include metal boxes with externally extending fins or ridges to increase the surface area of the metal. As electronic devices generate heat, plastic enclosures are often problematic, because they dissipate heat poorly.

A metal enclosure of a given configuration provides superior heat dissipation to a plastic enclosure of the same configuration. However, metal enclosures have greater weight, higher cost of manufacture, and greater susceptibility to corrosion when compared to plastic enclosures. The manufacture of metal enclosures requires additional steps of surface finishing. Modifications to the appearance of metal enclosures are often required for aesthetic purposes.

An advantage of the present invention is that it provides for an enclosure for electronic devices having a wall of a rigid plastic material with improved removal of heat from air within the enclosure.

Additional advantages of the invention, and objects of the invention, will be evident from the detailed description of an embodiment which follows.

SUMMARY OF THE INVENTION

In one aspect of the invention, an enclosure for electronic devices has a wall of a substantially rigid plastic, and a body of a material having thermal conductivity greater than the thermal conductivity of the rigid plastic. The body is in thermal communication with the rigid plastic of the wall at two different locations on the wall, so as to provide substantially improved heat transfer between the rigid plastic at the first location and the rigid plastic at the second location. Greater heat dissipation at the second location and thereby greater overall heat dissipation, is achieved.

In another aspect of the invention, an enclosure for electronic devices has a wall of substantially rigid plastic, and a body of a material having thermal capacity greater than that of the rigid plastic. Thermal capacity of the enclosure as a whole is thereby increased. Temperature fluctuations resulting from diurnal temperature changes are reduced; the material having a greater thermal capacity will tend to dissipate heat into the enclosure during times when the outside temperature is lower than the temperature of the material.

According to another aspect of the invention, an enclosure for electronic devices has a wall of a substantially rigid plastic, and elongated chambers defined in the wall. The elongated chambers contain a phase change material. The phase change material increases the heat capacity of the enclosure and provides transfer of heat energy by spreading the heat throughout the wall, thereby increasing the effective surface area available for heat dissipation. More particularly, the phase change material tends to absorb heat and increase in temperature. As the phase change material reaches a critical temperature, the phase change material changes phase, with no change in temperature until all of the material has changed phase. At higher temperatures, the phase change material conducts heat energy. Examples of phase change materials include paraffins and various salts, such as Glauber's salt.

According to another aspect of the invention, an enclosure for electronic components, has a wall of a rigid plastic material, the wall having a first location tending to be at a relatively high first location temperature, and a second location tending to be at a temperature lower than the first location temperature. A structure is provided for transferring heat from the wall at the first location to the wall at the second location. The structure may be, for example, a heat pipe, or a chamber formed within the wall and filled with a phase change material. The first location may be a top wall of a rectangular enclosure, and the second location may be a bottom or side wall. Heat pipes may be placed on or within the top wall and extend on or through one or more side walls, and extend to a bottom wall. Similarly, chambers defined within the wall and filled with a phase change material may run continuously from the top wall, to one or more side walls, and to a bottom wall.

DETAILED DESCRIPTION OF A PREFERRED EMBODIMENT

Figure 1:
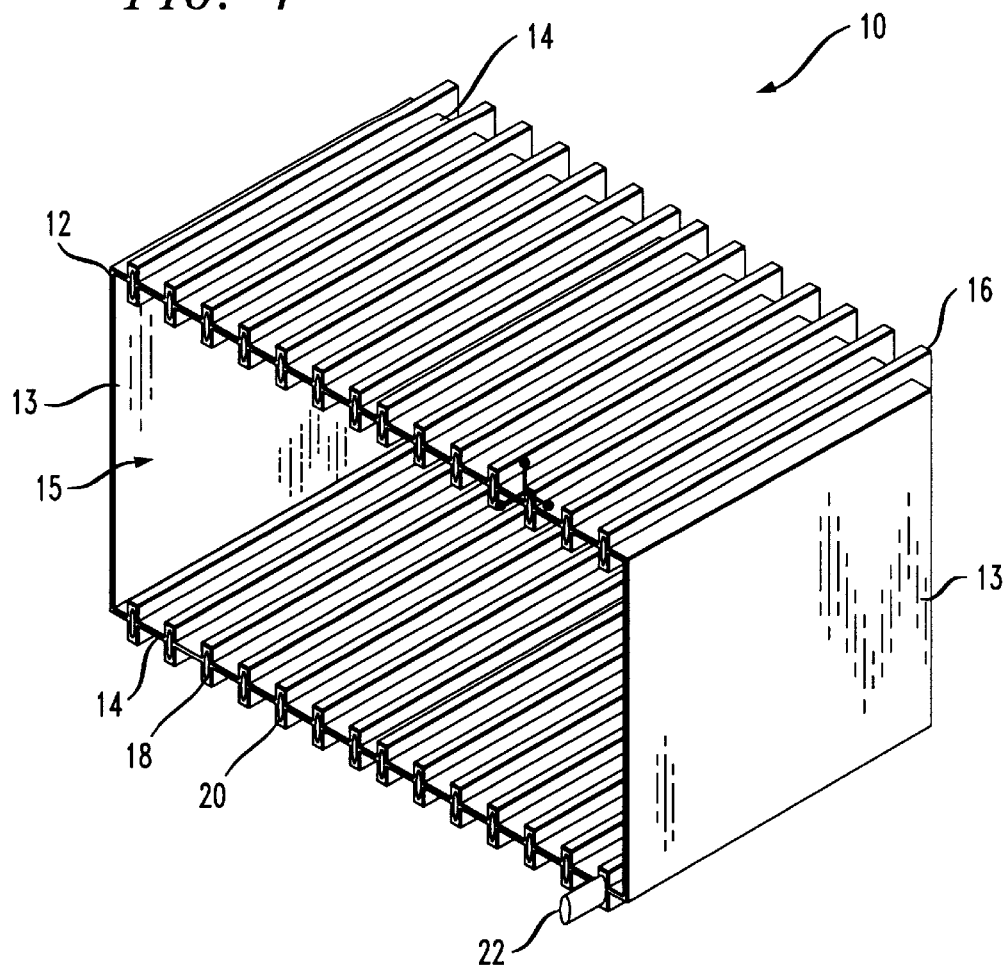
FIG. 1 is a perspective view of an enclosure according to the invention.

Referring to FIG. 1, there is depicted an enclosure 10 according to the invention. Enclosure 10 has wall 12 of a substantially rigid plastic material. The rigid plastic material will be selected for strength and rigidity sufficient to provide the form of enclosure 10. Such plastic materials as crystalline thermoplastic polyesters, such as the material sold by General Electric under the trademark VALOX, are examples of suitable plastic materials. Other rigid materials that have poor heat spreading in thin panels may also be employed in place of plastics. Wall 12 includes two substantially planar rectangular end panels 13, three substantially planar rectangular sides 14 and opening 15.

Enclosure 10 is intended for mounting of electronic devices in its interior. After mounting of suitable electronic devices. enclosure 10 may be sealed by addition of another substantially planar panel over opening 15.

Planar side panels 14 have ribs or ridges 16 defined therein. Ribs 16 are made of the same rigid plastic material as the remainder of panels 14. Ribs 16 have formed therein elongated chambers or channels 18. Ribs 16 on adjacent side panels 14 are preferably continuous, so that a single elongated chamber 18 extends in ribs 16 on at least two of side panels 14. A single elongated chamber 18 may extend in ribs 16 on all three side panels 14. The ends of chambers 18 are preferably sealed. Ribs 16 increase the surface area of enclosure 10 and thereby improve heat dissipation.

Elongated chambers 18 are filled with a material 20 in the form of elongated bodies 22. Material 20 has a high thermal capacity, or is a conductor of heat energy, or both. Material 20 may have good thermal conductivity, either at all relevant temperatures or over a portion of a range of temperatures of the likely environment of enclosure 10. For example, material 20 may be a phase change material. A phase change material is any material that changes phase at a defined temperature. Ordinarily, the change in phase in accordance with the invention will be a change between the solid and the liquid phase. The phase change material is selected to have a defined phase change temperature within a temperature range likely to be experienced within enclosure 10. The phase change temperature is also selected to be less than the maximum desirable temperature within enclosure 10. The maximum desirable temperature is selected based on the temperature range that the electronics in enclosure 10 can experience. The selected phase change material may have a high heat of fusion. A high heat of fusions provides a high heat capacity. Relatively small volumes of the phase change material are able to absorb and store relatively large amounts of energy when undergoing a phase change. The likely range of temperatures in enclosure 10 varies depending on the volume of enclosure 10, the amount of heat produced by electronics mounted in enclosure 10, the ambient temperature outside of the enclosure, and solar loading. Phase change materials that may be suitable for use as material 20 include salts, paraffins, and non-paraffin organics. As paraffins, for example, provide a wide range of selection of melting points, a suitable melting point can be selected. Sodium sulfate decahydrate, commonly known as Glauber's salt, has a phase change temperature of about 31 degrees Celsius, and a latent heat of 168 kilojoules per kilogram, where latent heat is defined as the amount of heat or energy required to cause a phase change. Calcium chloride hexahydrate has a phase transition temperature of 29.6 degrees Celsius and a latent heat of 200 kilojoules per kilogram. These salts are suitable phase change materials for many embodiments of the invention.

The material 20 in chambers 18 serves to control the temperature of the air in the interior of enclosure 10. The inventors have observed that in enclosures 10, the air temperature increases continuously and rapidly with height from the top to the bottom of enclosure 10. The inventors have also observed that rigid plastic in sheet form, such as that making up the walls 14 of enclosure 10, conducts heat relatively well across its thickness, but conducts heat very poorly laterally, i.e., has a high spreading resistance. As a result, if enclosure 10 is oriented so that panel 14 is positioned at the top and substantially horizontally, panel 14 will reach a relatively high temperature. Radiative cooling of enclosure 10 tends to be limited, compared to enclosures of the same dimensions with the same power dissipated by the electronics within the enclosure, having metal walls. The inventors believe that a major contributing factor in the difference is that the walls of a metal enclosure are at substantially the same temperature, because of the extremely low spreading resistance of metal. Within each chamber 18, all of the material 20, as a high heat transfer material, quickly reaches the same temperature along its entire length. Material 20 in each chamber 18 is in thermal contact with wall 12 at a high temperature location, on a top panel 14 of enclosure 10, and on a relatively low temperature location, on at least one other panel 14. Material 20 will conduct heat from the top one of panels 14 to other panels 14, which are initially at a lower temperature. Similarly, if there are hot spots (portion or areas of relatively high temperature) in one of panels 14 because of the proximity of electronic devices that are emitting heat, material 20 will conduct heat to other portions of panel 14, which were initially at a lower temperature. The release of heat out of the electronic device into the enclosure walls by radiation, convection and conduction is therefore increased, thereby increasing the dissipation of heat out of enclosure 10 and ultimately reducing the electronic component temperature in enclosure 10.

Chambers 18 are positioned in alignment with and partially within ribs 16. As a result, heat from material 20 in chambers 18 will tend to be dissipated by the additional surface area provided by ribs 16.

Channels 18 may be provided in wall 12 and filled with material 20 in a number of manners. For example, ribs 16 with channels 18 may be formed by a second molding step after forming of enclosure 10. Ribs 16 may be injection molded into enclosure 10. Alternatively, enclosure 10 may be formed in two separate inner and outer parts, which, when mated and sealed, form ribs 16 with channels 18. Material 20 is then forced into channels 20 under pressure, or by other suitable and well known techniques, and the ends of channels 18 are sealed to prevent material 20 from flowing out.

If material 20 is a phase change material, when the ambient temperature falls sufficiently low, or when solar loading is not present, material 20 will undergo a phase change from a liquid state to a solid state, emitting heat in the process. This process will tend to add heat energy to the plastic enclosure, which will in turn conduct heat to the air in the interior of enclosure 10. This will tend to moderate temperature fluctuations, at least on a daily basis. A sufficiently large volume of a suitable phase change material will permit reduction in temperature fluctuations as a result of seasonal ambient temperature changes. Reduction of temperature fluctuations will improve the expected reliability and lives of electronic devices in enclosure 10.

Figure 2:
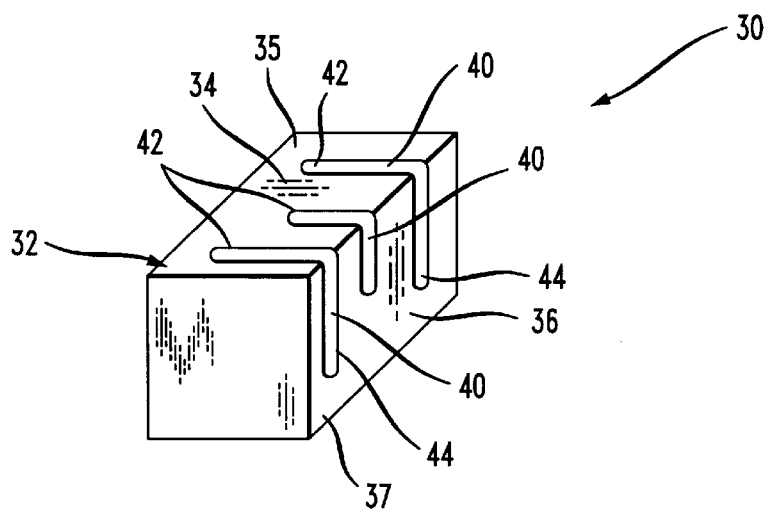
FIG. 2 is a somewhat schematic perspective view of an alternative embodiment of an enclosure according to the invention.
Figure 3:
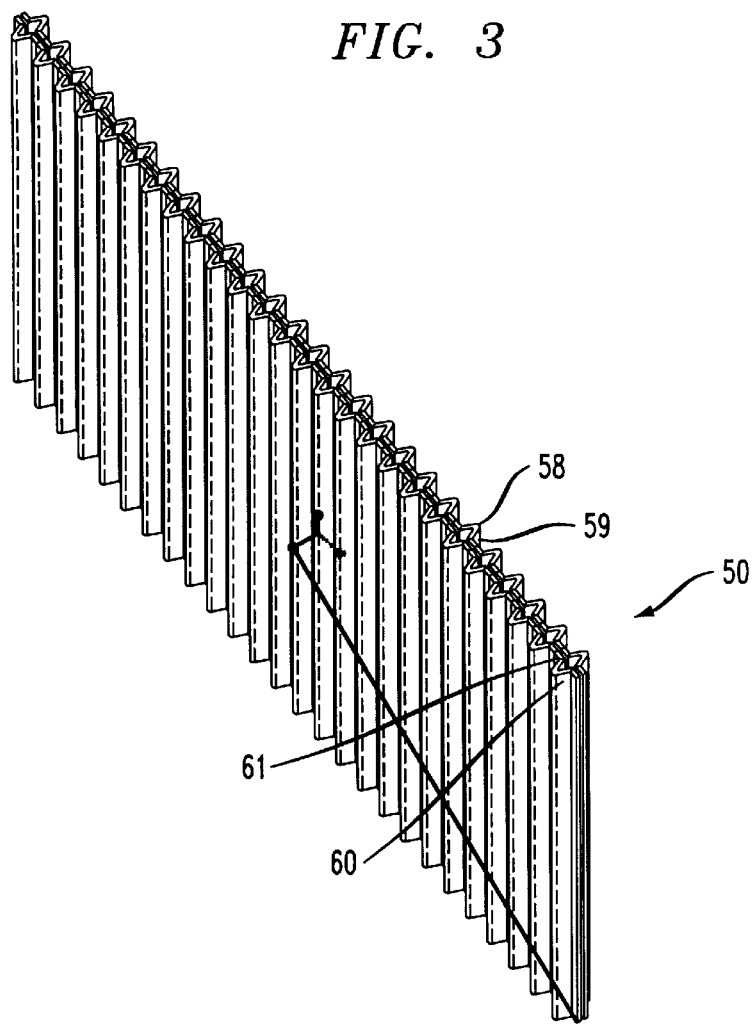
FIG. 3 is an isometric view of a wall panel for use in an embodiment of the invention

In an alternative embodiment, any heat pipe or other good conductor of heat may be provided, either in channels 18, or otherwise in contact with wall 12 at a high temperature location and at another location at a lower temperature, to conduct heat from wall 12 at the high temperature location to wall 12 at the low temperature location. Referring to FIG. 2, there is shown, somewhat schematically, enclosure 30, having wall 32, having high temperature location 34 at the entire surface of an upper panel 35, and relatively lower temperature location 36 on a lower portion of side panel 37. Heat pipes 40 are disposed with evaporator portions 42 of the heat pipe placed in thermal contact with wall 32 at high temperature location 34. If enclosure 30 is oriented with planar upper panel 35 in a horizontal position, any location on upper panel 35 would be a high temperature location 34, and therefore a suitable location for evaporator portions 42 of heat pipes 40 to be in thermal contact with wall 32. Condenser portions 44 of heat pipes 40 are placed in thermal contact with low temperature location 36 on side panel 37. Heat is then transferred to wall 37 at low temperature location 36, and dissipated. Extended ribs, fins, or other structures that increase the surface area of wall 32, may be provided over or adjacent to condenser portions 44 of heat pipes 40 to improve heat dissipation. Of course, other structures, such as metal strips or wires, or lengths of other materials having good heat conduction, may be employed in addition to or in place of heat pipes as a means for transferring heat from high temperature location 34 to low temperature location Referring now to FIG. 3, there is shown an alternative embodiment of a panel for use in an enclosure according to the invention. Panel 50 has inner wall 58 and outer wall 60. Both inner wall 58 and outer wall 60 may be of a suitable rigid plastic material. Each of inner wall 58 and outer wall 60 are generally planar panels that are corrugated, with planar surfaces 59, 61. In the fabrication of an enclosure according to the invention, a length of inner wall 58 may be scored, bent and sealed by use of a suitable solvent/adhesive to provide four wall a generally rectangular form. The other two walls may be planar panels of the same rigid plastic material. Heat pipes may then be placed in the grooves defined in inner panel 58 on one surface thereof. Outer panel 60 may then be applied on inner panel 58, with planar surfaces 59 and 61 in contact with and suitably bonded to one another. The heat pipes are sealed pipes, which may be metal. Sealed pipes are necessary in applications where the plastic material of panel 50 would not be effective. For example, scaled pipes are necessary when employing heat pipes using water as a working fluid, as plastics are generally permeable to water. Also, an outer plastic layer may be overmolded over inner wall 58 and the heat pipes, rather than applying another rigid corrugated wall.

Figure 4:
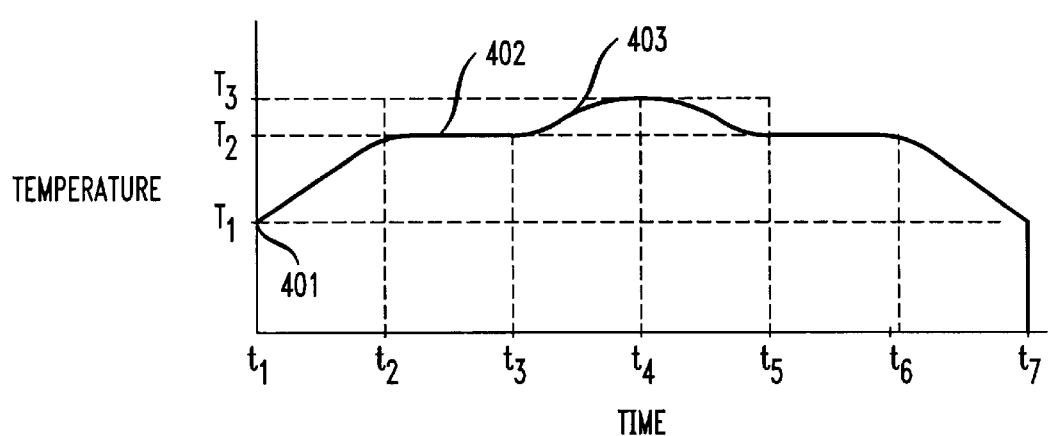
FIG. 4 is a plot showing exemplary air temperature within an enclosure versus time over a diurnal cycle.

Referring to FIG. 4, there is shown a graph plotting air temperature within an enclosure according to the invention, having a phase change material, against time over a cycle of exterior temperature changes, such as a diurnal cycle. The temperature T refers to air temperature measured at a selected point in the enclosure. As noted above, the air temperature within a sealed enclosure at any given time varies with vertical location. At the beginning of the cycle, at time t1, at reference numeral 401, the air temperature within the enclosure is at a relative minimum. Time t1 may be, in a diurnal cycle, approximately at sunrise. Between time t1 and time t2, the temperature steadily increases. In FIG. 4, the temperature is illustrated as increasing linearly only by way of example. The actual temperature increase will depend on the increase in the ambient air temperature exterior to the enclosure and changes in solar loading. Between time t1 and time t2, energy is absorbed by the phase change material, and the temperature of the phase change material increases. At time t2, the temperature of the phase change material reaches its critical temperature. The critical temperature is the temperature at which the phase change occurs. The phase change material remains at its critical temperature until all of the phase change materials has undergone a phase change to the liquid phase. As a result, the temperature of air in the enclosure remains constant between time t2 and time t3, as indicated by reference numeral 402. This is because the temperature gradient between the air and the phase change material is dictated by characteristics and shape of the rigid plastic material of the wall. The temperature gradient between the air and the phase change material refers to the equilibrium temperature differential between the air and the phase change material. Characteristics include the thickness and thermal conductivity of the rigid plastic material. Temperature T2 is greater than the phase change temperature of the phase change material. At time t3, the phase change material is entirely in the liquid state. After time t3 and until time t4, the combination of energy output by devices in the enclosure and solar loading exceeds the ability of the box to dissipate heat. As a result, from time t3 until time t4, the temperature of the air in the enclosure increases from temperature T2 to temperature T3. This is indicated at reference numeral 403. After time t4, the temperature decreases from temperature T3. This is due to a decrease in solar loading, for example. When the air temperature in the enclosure decreases to temperature T2, the phase change material has reached its phase change temperature. As solar loading and/or the ambient air temperature decreases, the phase change material releases energy as it solidifies, thereby tending to maintain the air temperature within the enclosure at a constant temperature. At time t6, the phase change material has fully solidified. After time t6, the temperature in the enclosure decreases. As the temperature decreases, the phase change material cools and releases energy. As a result, the decrease in the air temperature in the enclosure is less than the decrease would be in the absence of the phase change material. The temperature reaches temperature T1 again at time t1. The cycle is then repeated.

The use of the phase change material reduces the maximum temperature T3 from the value it would have absent the phase change material. This will prevent, assuming proper design, the temperature of the components from exceeding their maximum rated value. It may also permit the substitution of less expensive components. For example, it may be possible to substitute for industrial specification components. Also, the phase change material reduces the temperature gradient between the minimum temperature T1 and the maximum temperature T3. The reduction in the temperature change in the cycle tends to extend component life. For example, using a phase change material with an approximate phase change temperature of 30° Celsius, an enclosure can be designed where T3 does not exceed about 60° Celsius under anticipated conditions.

While specific embodiments of the invention have been described in detail, it will be appreciated by those skilled in the art that various modifications and alternatives to those details could be developed in light of the overall teachings of the disclosure. Accordingly, the particular arrangements of the apparatus disclosed and selections of materials are meant to be illustrative only and not limiting to the scope of the invention, which is to be given the full breadth of the following claims, and any and all embodiments thereof.

What is claimed is:

1. An enclosure for electronic devices, comprising a wall, said wall comprising;

a first material, said first material being a substantially rigid material characterized by a thermal capacity and a poor thermal conductivity; and a body of a second material having thermal capacity and thermal conductivity greater than the thermal capacity and thermal conductivity of said first material, said body being in direct thermal communication with said first material at a first location and a second location so as to provide improved heat transfer between said first material at said first location and said first material at said second location.

2. The enclosure of claim 1, wherein said first material defines a sealed chamber, said body being disposed in said chamber.

3. The enclosure of claim 2, further comprising a plurality of second sealed chambers defined by said wall, each of said second sealed chambers having said second material disposed therein.

4. The enclosure of claim 2, wherein said wall has a generally planar panel having an elongated rib extending therefrom, said sealed chamber being aligned with said rib.

5. The enclosure of claim 1, wherein said wall comprises a first substantially planar panel and a second substantially planar panel attached thereto, said chamber extending continuously into said first and said second panels.

6. An enclosure for electronic devices, comprising a wall, said wall comprising:
   a first material, said first material being a substantially rigid material characterized by poor thermal conductivity; and
   a body of a second material having thermal conductivity greater than the thermal conductivity of said first material;
   said body being in thermal communication with said first material at a first location and a second location so as to provide improved heat transfer between said first material at said first location and said first material at said second location.

7. The enclosure of claim 1, wherein said first material defines a sealed chamber, said body being disposed in said chamber.

8. The enclosure of claim 7, further comprising a plurality of second sealed chambers defined by said wall, each of said second sealed chambers having said second material disposed therein.

9. The enclosure of claim 7, wherein said wall has a generally planar panel having an elongated rib extending therefrom, said sealed chamber being aligned with said rib.

10. The enclosure of claim 1, wherein said wall comprises a first substantially planar panel and a second substantially planar panel attached thereto, said first location being on said first panel and said second location being on said second panel.

11. The enclosure of claim 1, wherein said second material is a phase change material.

12. The enclosure of claim 11, wherein said second material comprises a salt.

13. The enclosure of claim 11, wherein said second material is water.

14. An enclosure for electronic devices, comprising a wall, said wall comprising a substantially rigid plastic characterized by poor thermal conductivity, said rigid plastic defining a plurality of elongated sealed chambers, said chambers containing a phase change material in direct thermal communication with said elongated sealed chambers.

15. The enclosure of claim 14, wherein said wall comprises a first substantially planar panel and a second substantially planar panel attached to said first panel, at least one of said chambers extending across said first panel and said second panel.

16. The enclosure of claim 15, further comprising a protruding rib extending outward from said first and second panels in alignment with at least one of said chambers.

17. An enclosure for electronic components, comprising:
   a wall of a rigid plastic material, said wall having a first location tending to be at a first location temperature, and a second location tending to be at a temperature lower than said first location temperature; and
   means for transferring heat from said wall at said first location to said wall at said second location, said means for transferring being in direct thermal communication with said wall at said first location and said second location.

18. The enclosure of claim 17, wherein said heat transferring means comprises a heat pipe.

19. The enclosure of claim 18, wherein said heat pipe comprises water as a working fluid.

20. The enclosure of claim 18, wherein said heat pipe is on at least two sides of the enclosure.

21. The enclosure of claim 17, wherein said heat transferring means comprises a phase change material.

22. The enclosure of claim 21, wherein said phase change material is contained in a sealed chamber defined in said wall.

23. An enclosure for electronic components having a known heat output, said enclosure having walls of a rigid plastic, and a phase change material in said walls, wherein during a cycle of temperature loading, a temperature of air inside the enclosure increases from a first temperature at commencement of the cycle, until reaching a second temperature where said phase change material commences a phase change, said air temperature remaining at said second temperature until said phase change material completes said phase change, said air temperature increasing to a maximum temperature after said phase change material completes said phase change, said air temperature decreasing to said second temperature, after said maximum temperature is reached, wherein said phase change material commences a phase change, said air temperature remaining constant until said phase change material completes said phase change, and said air temperature decreasing while said phase change material emits heat into the enclosure.

* * * * *

UNITED STATES PATENT AND TRADEMARK OFFICE
CERTIFICATE OF CORRECTION

PATENT NO. : 6,169,247 B1
DATED : January 2, 2001
INVENTOR(S) : Thomas F. Craft, Jr., Jason A. Kay, Ivan Pawlenko, Alfonso J. D'Alessio, Anthony R. Tancreto and George Shevchuk It is certified that error appears in the above-identified patent and that said Letters Patent is hereby corrected as shown below:

Column 6,
Line 61, delete ";" and insert therefor -- : --;
Line 63, after the term "by", delete the terms " a thermal capacity and a";
Line 65, after the term "having", delete the terms "thermal capacity and";
Line 66, after the second occurrence of the term "thermal", delete the terms "capacity and thermal";

Column 7,
Line 18, after the term "thereto,", delete the terms "said chamber extending continuously into said first and said second panels" and insert therefor -- said first location being on said first panel and said second location being on said second panel --;
Line 36, after the number "8.", delete all the remaining terms in claim 8, and replace with -- The enclosure of claim 6, wherein said second material is water. --;

Column 7,
Line 40, after the number "9.", delete all the remaining terms in claim 9, and replace with -- An enclosure for electronic devices, comprising a wall, said wall comprising:
  a first material, said first material being a substantially rigid material characterized by a thermal capacity and a poor thermal conductivity; and
  a body of a second material having thermal capacity and thermal conductivity greater than the thermal capacity and thermal conductivity of said first material, said body being in direct thermal communication with said first material at a first location and a second location so as to provide improved heat transfer between said first material at said first location and said first material at said second location --.

UNITED STATES PATENT AND TRADEMARK OFFICE
CERTIFICATE OF CORRECTION

PATENT NO. : 6,169,247 B1
DATED : January 2, 2001
INVENTOR(S) : Thomas F. Craft, Jr., Jason A. Kay, Ivan Pawlenko, Alfonso J. D'Alessio, Anthony R. Tancreto and George Shevchuk It is certified that error appears in the above-identified patent and that said Letters Patent is hereby corrected as shown below:

Column 7,
Line 43, after the number "10.", delete all the remaining terms in claim 10, and replace with -- The enclosure of claim 9, wherein said first material defines a sealed chamber, said body being disposed in said chamber. --;

Column 7
Line 48, after the number "11.", delete all the remaining terms in claim 11, and replace with -- The enclosure of claim 10, further comprising a plurality of second sealed chambers defined by said wall, each of said second sealed chambers having said second material disposed therein. --;

Signed and Sealed this

Second Day of October, 2001

Attest:

NICHOLAS P. GODICI
Attesting Officer
Acting Director of the United States Patent and Trademark Office

UNITED STATES PATENT AND TRADEMARK OFFICE
CERTIFICATE OF CORRECTION

Page 1 of 1

PATENT NO. : 6,169,247 B1
DATED : January 2, 2001
INVENTOR(S) : Thomas F. Craft, Jr., Jason A. Kay, Ivan Pawlenko, Alfonso J. D'Alessio, Anthony R. Tancreto and George Shevchuk It is certified that error appears in the above-identified patent and that said Letters Patent is hereby corrected as shown below:

Column 6,
Line 61, delete ";" and insert therefor -- : --;

Column 7,
Line 16, delete "1" and insert therefor -- 2 --;
Line 28, insert -- direct -- before the word "thermal";
Lines 33, 43, and 48, delete "1" and insert therefor -- 6 --;

This certificate supersedes Certificate of correction issued October 2, 2001.

Signed and Sealed this

Twenty-seventh Day of November, 2001

Attest:

NICHOLAS P. GODICI
*Attesting Officer*     *Acting Director of the United States Patent and Trademark Office*